United States Patent [19]

Bokor et al.

[11] Patent Number: 4,721,910

[45] Date of Patent: Jan. 26, 1988

[54] HIGH SPEED CIRCUIT MEASUREMENTS USING PHOTOEMISSION SAMPLING

[75] Inventors: Jeffrey Bokor, Holmdel; Anthony M. Johnson, Spotswood; Ralph H. Storz, Colts Neck, all of N.J.

[73] Assignee: American Telephone and Telegraph Company, AT&T Bell Laboratories, Murray Hill, N.J.

[21] Appl. No.: 906,306

[22] Filed: Sep. 12, 1986

[51] Int. Cl.⁴ .......................................... G01N 23/225
[52] U.S. Cl. ........................... 324/158 R; 324/158 D; 324/158 T; 250/305; 250/310; 250/311
[58] Field of Search ............ 324/158 R, 158 D, 73 R; 250/310, 311, 491.1, 492.1, 305, 306, 307

[56] References Cited

U.S. PATENT DOCUMENTS

| 4,486,660 | 12/1984 | Feuerbaum | 250/310 |
| 4,554,455 | 11/1985 | Todokoro et al. | 250/305 X |
| 4,575,630 | 3/1986 | Lukianoff | 250/307 |
| 4,634,972 | 1/1987 | Fazekas | 324/158 R X |

OTHER PUBLICATIONS

"A Technique for the Linearization of Voltage Contrast in the Scanning Electron Microscope", *J. Phys. E.: Sci. Instrum.*, 4, 1971, pp. 334–336, Gopinath et al.
"Voltage Distributions in X-Band n+-n-n+ Gunn Devices Using a SEM", *IEEE Trans. Electron Devices*, vol. ED-23, No. 10, Oct. 1976, P. J. Fentem et al, pp. 1159–1165.
"Nonlinear Photoelectric Emission from Metals Induced by a Laser Radiation", *Sov. Phys. Usp.*, 20(6), Jun. 1977, S. I. Anisimov et al, pp. 467–488.
"Gigahertz Stroboscopy with the Scanning Electron Microscrope", *Rev. Sci. Instrum.*, 49(9), Sep. 1978, T. Hosokawa et al, pp. 1293–1299.
"Waveform Measurements on Gigahertz Semiconductor Devices by Scanning Electron Microscope Strobos-copy", *Appl. Phys. Lett.*, 39, 1 Jul. 1981, H. Fujioka et al., pp. 81–82.
"Fundamentals of Electron Beam Testing of Integrated Circuits", *Scanning*, vol. 5, 1983, E. Menzel et al., pp. 103–122.
"80X Single-Stage Compression of Frequency Doubled Nd:Yttrium Aluminum Garnet Laser Pulses", *Appl. Phys. Lett.*, 44, 15 Apr. 1984, A. M. Johnson et al., pp. 729–731.
"Electron Beam Probing of Integrated Circuits", *Solid State Tech.*, Dec. 1985, E. Menzel et al, pp. 63–70.
"Electron-Beam Testing of VLSI Chips Gets Practical", *Electronics*, Mar. 24, 1986, pp. 51–54.

*Primary Examiner*—Reinhard J. Eisenzopf
*Assistant Examiner*—Vinh P. Nguyen
*Attorney, Agent, or Firm*—Daniel D. Dubosky; Gregory C. Ranieri

[57] ABSTRACT

Apparatus for measuring the voltage waveform on the metallization lines of an integrated circuit is described. Short high powered pulses of light are coupled from a laser and focused on the metallization line of the integrated circuit which is coupled to receive a voltage waveform that is synchronized to the output laser pulses. Electrons are emitted from the metallization line due to the multiphoton photoelectronic effect induced by the pulses of light. An electron energy analyzer having a uniform extraction grid as its most remote element is positioned with the extraction grid as close as possible to the integrated circuit and the laser pulses are focused through one of the holes of this uniform grid. An output circuit is connected in a feedback arrangement which receives the output pulses of the energy analyzer and develops a voltage on a second uniform grid called the retarding grid that is positioned a predetermined distance from the extraction grid inside the electron energy analyzer. A sinusoidal voltage is superimposed on the signal provided to the retarding grid in order to eliminate the effect of noise components in the amplitude of the laser pulses.

4 Claims, 5 Drawing Figures

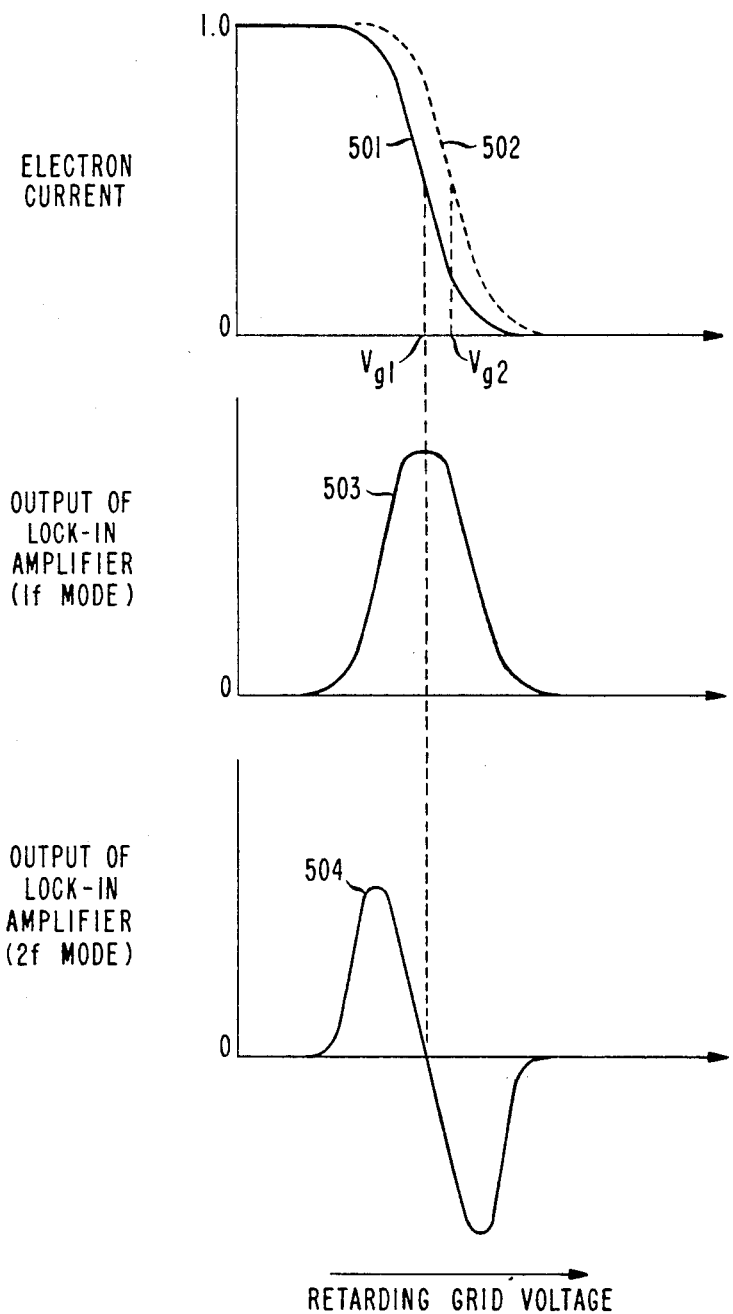

HIGH SPEED CIRCUIT MEASUREMENTS USING PHOTOEMISSION SAMPLING

BACKGROUND OF THE INVENTION

This invention relates to measuring apparatus and, more particularly, to measuring apparatus that can be used to determine voltage waveforms on metalization lines of any integrated circuit or electronic device.

Integrated circuits are becoming larger and larger in size with several hundred thousand transistors per circuit. The number of transistors per circuit and their speed of operation has been increasing to the point where mechanical probes are no longer usable to sample the waveforms present on these circuits. One technique that has evolved to replace the mechanical probe is known as electron beam probing. This technique uses an electron beam of the type generated in scanning electron microscopes to impinge on a metal line of the circuit. The emission of secondary electrons from the integrated circuit line is then utilized in order to determine the voltage present during a given instant in time. Insertion of a delay in either the voltage waveform or in the electron beam can be utilized to determine, in a stroboscopic fashion, the value of the voltage waveform during several instants in time thereby completing the voltage waveform measurement. A description of this type of electron beam probing can be found in the article entitled "Fundamentals of Electron Beam Testing of Integrated Circuits," by E. Menzel et al., *Scanning*, Vol. 5, 1983, pp. 103–122. Electron beam probing systems are now commercially available and are capable of waveform sampling with 200 picosecond time resolution. Unfortunately the integrated circuit art is proceeding at a rapid pace in producing faster and faster circuits such that this time resolution will no longer be satisfactory. Even greater resolutions in the order of tens of picoseconds will soon be necessary.

SUMMARY OF THE INVENTION

Temporal resolution of better than 40 picoseconds can be obtained by sampling the voltage waveform on an integrated circuit through use of a multiphoton photoelectric effect that is induced by a high powered short pulsed laser source directed onto the metal line of an integrated circuit. Multiphoton absorption causes electrons to be emitted by that line and these electrons can then be analyzed to determine their energy. From this energy analysis of the electrons the potential on the metallization line at the time the laser pulse arrived can be determined.

The present invention is based on the discovery that the extraction grid which is used to attract the electrons toward the electron energy analyzer must be placed as close to the sampled surface as possible with as high an extraction field as possible in order to achieve temporal resolutions in the order of tens of picoseconds. In accordance with the present invention, the electron energy analyzer is constructed with a uniform extraction grid positioned as the most remote element such that it can be brought to within very close distances of the circuit under measurement. Unlike the grids which are used in electron beam probing, the extraction grid is a uniform one and the laser beam is focused through one of the holes normally present in the uniform grid.

It is a feature of the present invention that a second grid known as the retarding grid is also a uniform one that is positioned a short distance from the extraction grid inside the energy analyzer. The effect of amplitude variations on the output of the laser can be removed by placing a substantially constant voltage on the extraction grid and a feedback voltage on the retarding grid which has a superimposed AC component whose frequency is greater than that of the noise amplitude variations at the output of the laser. As a result of this superimposed AC component the effect of the noise is removed.

BRIEF DESCRIPTION OF THE DRAWING

The invention will be more readily understood after reading the following detailed description in combination with the drawings, wherein:

FIGS. 4 and 5 are curves that are useful in describing the operation of the present invention.

DETAILED DESCRIPTION

Figure 1:
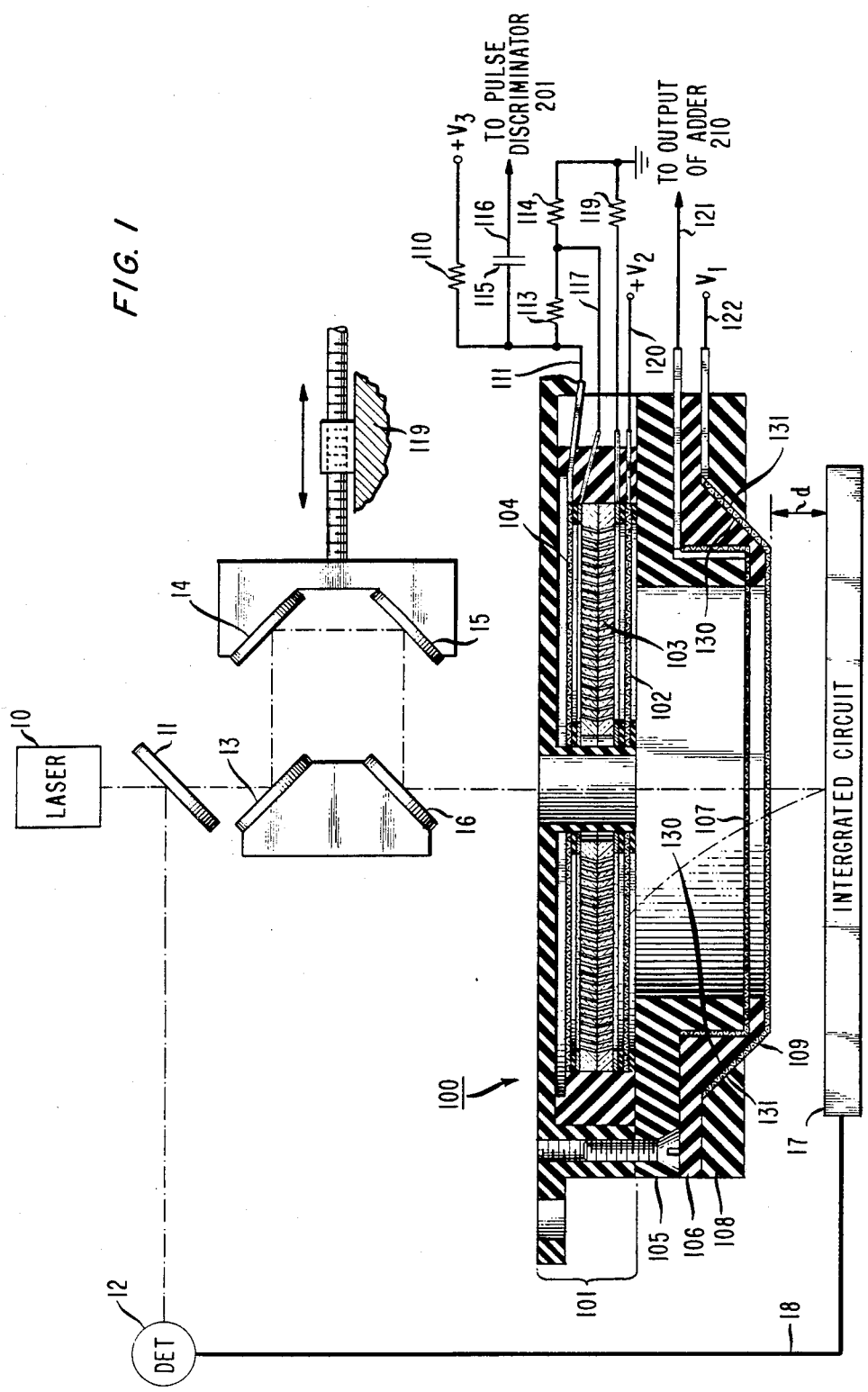
FIG. 1 is a schematic block diagram with a cross-section of an electron energy analyzer of the type constructed in accordance with the present invention.

A block diagram of the photoemission sampling measuring apparatus constructed in accordance with the present invention is shown in FIG. 1. In FIG. 1 a laser 10 provides short pulses having a duration of less than 500 fsec at a wavelength of 532 nm, a repetition rate of 100 MHz and an average power of 200 mW. The power of the laser must be sufficient in order to provide several hundred $MW/cm^2$ at the surface of the integrated circuit under measurement in order to be sufficiently high to produce easily detected multiphoton photoemission. Although many types of lasers can be utilized, the laser used in the present apparatus is described in the article entitled "80 X single-stage compression of frequency doubled Nd:yttrium aluminum garnet laser pulses," by A. M. Johnson, et al., *Appl. Phys. Letters*, 44(8), 15 Apr. 1984, pp. 729–731. The output of laser 10 is directed toward a beam splitter 11 which provides a reflected beam that impinges on a photodetector 12. The output of this photodetector 12 is coupled by way of line 18 in order to generate a waveform on integrated circuit 17 that is synchronized with the output of laser 10. The beam passing through beam splitter 11 is reflected by mirrors 13, 14, 15 and 16 such that it is directed through electron energy analyzer 100 to a metallization line on integrated circuit 17. Mirrors 14 and 15 are positioned on an adjustable stage 19 which can be utilized to introduce varying amounts of delay into the optical pulse that impinges on integrated circuit 17. Electron energy analyzer 100 is used to determine the energy of the electrons that are caused to emit from integrated circuit 17 as a result of the multiphoton absorption created by the pulses from laser 10. As in the electron beam probing systems, the delay of the optical pulse relative to the electrical waveform provides a series of measurements which can then be plotted in order to provide the voltage waveform on integrated circuit 17.

The electron energy analyzer 100 was constructed by first obtaining an electron energy analyzer of the type utilized in connection with electron beam probing apparatus. This portion is designated as 101 in FIG. 1 and was obtained from the Galileo Electronic-Optics Corporation, Galileo Park, Sturbridge, Mass. 01518. It is designated as Model 3025. In this portion 101 of the electron energy analyzer a collector grid 102 is positioned such that it can attract electrons and deliver them to an input of multichannel plate 103. As is well known to those skilled in the art, each electron coupled to the input of a multichannel plate causes a large number of electrons to be delivered at the output of the multichannel plate. This large number of electrons is attracted by anode 104 in order to provide a pulse of electrons at the output of the electron energy analyzer.

Figure 3:
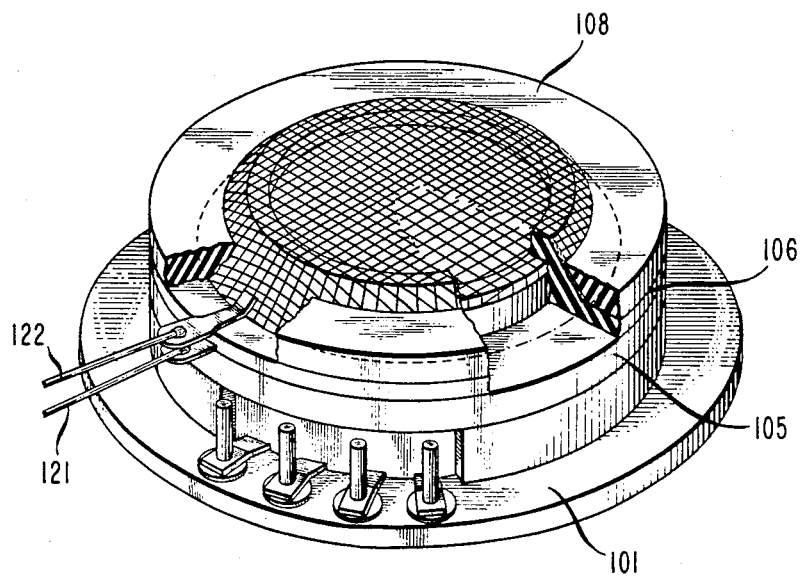
FIG. 3 is a pictorial view of the electron energy analyzer constructed in accordance with the present invention.

In accordance with the present invention, the electron analyzer portion 101, available from the Galileo Electronic Optics Corporation, is modified by adding an insulating cylindrical member 105 to the collector grid side of portion 101 as shown in FIGS. 1 and 3. The retarding grid 107 is then stretched over this insulating member 105 and held in place by a second insulating cylindrical member 106. As indicated in FIGS. 1 and 3 the insulating member 106 protrudes from the collector side of portion 101 and has a tapered surface 130 around which an extraction grid 109 can be positioned and stretched when insulating member 108 having a similar tapered surface 131 is clamped as shown in FIGS. 1 and 3 with the tapered surface 131 of member 108 aligned with the tapered surface 130 of member 106 and the ends of the collector grid pressed in between the two tapered surfaces. The resulting structure has an extraction grid 109 which is positioned as the most remote element of the electron energy analyzer 100 such that it can be positioned at an extremely close distance d from the integrated circuit 17 under measurement. The present invention is based on the discovery that this distance must be kept as short as possible and as high a field as possible must be established between the extraction grid 109 and integrated circuit 17. The amount of field that can be utilized is of course limited in that any arc over to the integrated circuit must be prevented in order to avoid damage to the integrated circuit.

The electron transit time between the integrated circuit 17 and the collector grid 109 may be calculated with the following equation:

$$t = 3.37 \times 10^{-9} (d/E)^{\frac{1}{2}} \tag{1}$$

where d is the distance from the sample to the extraction grid in millimeters, E is the extraction field in volts per millimeter, and t is in seconds. In the apparatus which was constructed anode 104, multichannel, plate 103, and collector grid 102 each had a 6 millimeter diameter center hole through which the electron beam is caused to pass. In accordance with the present invention both the extraction grid 109 and retarding grid 107 are entirely uniform with no special holes. The beam from laser 110 is simply focused through the holes normally present in each of the grids. The retarding grid mesh size was chosen to be 50 wires per inch and the extraction grid mesh size was chosen to be 100 wires to the inch resulting in grid spaces of 450 micrometers and 200 micrometers for the retarding grid and extraction grid respectively. As a result of this arrangement the electron energy analyzer 100 was placed such that the extraction grid 109 was approximately 750 micrometers away from integrated circuit 17. The entire electron energy analyzer structure must of course be held in a vacuum chamber which provides approximately $10^{-6}$ torr pressure.

As indicated in FIG. 1, the extraction grid 109 is connected by way of line 122 to a voltage source plus $V_1$ which in the apparatus constructed was equal to 4000 volts. The voltages present on the integrated circuit 17 are typically in the order of several volts and therefore a large electric field is set up between extraction grid 109 and the metallization line present in integrated circuit 17. This large electric field causes the electrons that are emitted to be attracted to the extraction grid. The amount of energy that each electron has when it reaches the extraction grid is of course dependent on the magnitude of the electric field between the extraction grid and the metallization line on circuit 17. Since the electron energy is going to be analyzed to infer the potential on the metallization line, this field should be constant during the period of time that the electron is making its transition from the metallization line to the extraction grid 109. Otherwise the changing field will not permit us to infer the potential from which the electron was emitted. It is this analysis which causes us to conclude that the distance d between the extraction grid 109 and integrated circuit 17 must be made as small as possible in order to reduce the trajectory time and thereby improve the temporal resolution of the measuring apparatus. Once the electron passes by extraction grid 109 its energy has been fixed by the electric field established by the source $V_1$ and the metallization line, and we need no longer be concerned about any changes that may occur on the metallization line.

Figure 2:
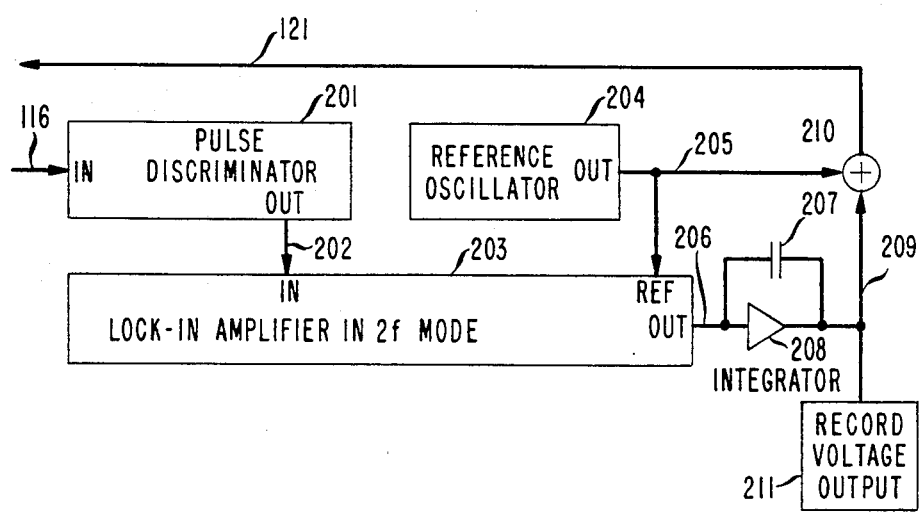
FIG. 2 is a schematic block diagram of the electronic circuitry used to develop the voltage that applied to the retarding grid, which voltage has a superimposed AC component in accordance with the present invention.

The retarding grid 107 is connected by line 121 to the circuit shown in FIG. 2. The precise voltage applied by way of line 121 to the retarding grid 107 will be clear after the discussion hereinbelow relating to the circuit of FIG. 2. It should be apparent to those skilled in the art, however, that a potential on retarding grid 107 equal to that of the potential on the metallization line under measurement will permit about 50 percent of the available electrons to be coupled through retarding grid 107. Accordingly, one technique of measuring changes in potential on the metallization line is to measure changes in the potential on retarding grid 107 that are required to maintain 50 percent of the available electrons passing through to collector grid 102.

Collector grid 102 is connected by way of line 120 to a potential source $+V_2$ which is equal in the present apparatus to a value of 100 V. The potential source $+V_3$ having a magnitude of about 5000 volts is coupled by way of a resistor 110 to line 111 which connects a potential of about 3000 volts to anode 104. The series string of resistors 113 and 114 connected between line 111 and ground permits a lower voltage to be connected by way of line 117 to the output of multichannel plate 103. The input of multichannel plate 103 is connected by way of line 118 through a resistor 119 to ground thereby resulting in a potential drop of about 2500 volts across multichannel plate 103. Each electron coupled to the input of multichannel 103 causes a large number of electrons to be coupled to anode 104 thereby creating a current pulse on line 111 which is coupled by way of blocking capacitor 115 to line 116 which in turn is coupled to the circuit shown in FIG. 2.

Figure 4:
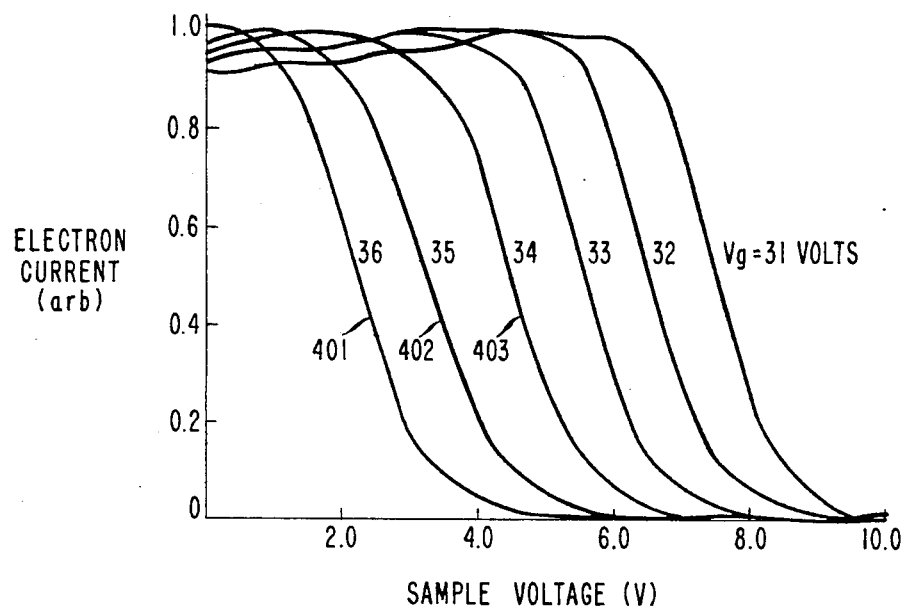

The operation of the apparatus described thus far can best be explained by referring to the curves shown in FIG. 4. Plots of the electron current provided at the anode electrode in arbitrary units versus the sample voltage for different values of retarding grid voltages ($V_g$) are shown in FIG. 4. Referring to curve 401 which is the curve for a retarding grid voltage of 36 volts, an increase in the sample voltage on the metallization line of the integrated circuit from zero to two volts causes the amount of current to be decreased by about fifty percent. The shape of these curves is dictated by the fact that increased sample voltage decreases the electric field between the extraction grid and the integrated circuit thereby decreasing the amount of energy that an electron has when passing the extraction grid and in turn decreasing the number of electrons which can overcome the retarding grid voltage. The curves for decreased amounts of retarding grid voltage ($V_g$) permit higher and higher values of sample voltage for equivalent amounts of output current since decreasing the retarding grid voltage increases the number of electrons that can overcome the retarding grid voltage. It should be noted from the curves in FIG. 4 that a one to one correspondence exists between changes in the sample voltage as compared with changes in the retarding grid voltage particularly for electron currents equal to 0.5 arbitrary units, that is, for currents that correspond to 50 percent of the electrons that are available. By utilizing the feedback apparatus to be described hereinafter, the measurement apparatus is caused to operate along a line drawn parallel to the abscissa in FIG. 4 which intersects the ordinate at about 0.5. This of course corresponds to an electron current equal to 50 percent of the electrons that are available. When operating along this line the value of the retarding grid voltage provides a measurement of the sample voltage on the metallization line from which the electrons were emitted.

The current pulses which are developed on line 116 in FIG. 1 at the output of the blocking capacitor 115 are coupled in FIG. 2 to the input of a pulse discriminator circuit 201. This circuit 201 is simply a threshold type circuit which rejects all pulses lower than a predetermined magnitude thereby removing the effects of extraneous pulses which may be developed within the electron energy analyzer 100. Only the pulses which resulted from an electron that has been coupled into the multichannel plates ar permitted to pass by pulse discriminator circuit 201 by way of line 202 to the input of a lock-in amplifier 203. The lock-in amplifier 203 is similar to an extremely narrow bandpass filter in that it normally provides at its output a voltage which represents the energy present at its input at a frequency determined by the frequency of the voltage provided to its reference input. The lock-in amplifier in the present apparatus is caused to operate in the 2f mode or twice frequency mode thereby causing a zero voltage to be present at its output when the maximum energy at the reference frequency is present at its input.

The output voltage provided on line 206 by lock-in amplifier 203 is coupled to the input of an amplifier 208 which is connected with a capacitor 209 as an integrator circuit. Accordingly, voltages on lines 206 are integrated to provide a voltage on line 209 which is coupled to one input of a summing circuit 210. As will be apparent hereinafter, the voltage on line 209 is the DC component of the voltage that is coupled to the retarding grid. This voltage may be recorded by an external apparatus 211 and plotted to provide a representation of the voltage waveform on the metallization line of integrated circuit 17. A second input of summing circuit 210 is connected by way of line 205 to receive a sinusoidal voltage from the output of reference oscillator 204. This voltage is superimposed on the DC component from line 209 by summing circuit 210 before coupling both voltages by way of line 121 to the retarding grid 107. The sinusoidal voltage from oscillator 204 is also coupled to the reference input of the lock-in amplifier 203.

The operation of the feedback loop provided by the circuit of FIG. 2 can best be explained by referring to the curves shown in FIG. 5. Curve 501 in FIG. 5 is a plot of the electron circuit provided by the apparatus of FIG. 1 on line 116 as a result of changes in the retarding grid voltage for a predetermined fixed sample voltage on the metallization line of integrated circuit 17. Curve 501 is similar in shape to the curves shown in FIG. 4. As indicated in FIG. 5 increasing the retarding grid voltage causes less current to be developed on output line 116. This shape results from the fact that increasing the retarding grid voltage requires the electrons to have higher energy before they can pass the retarding grid and therefore less current is provided at the output. In FIG. 5 of retarding grid voltage, $V_{g1}$, is the voltage at which curve 501 has a maximum slope. This point corresponds roughly to the point at which the output current is equal to about 50 percent of its maximum value. If the lock-in amplifier 203 is operated in its 1f mode, the output of the lock-in amplifier would be represented by curve 503 in FIG. 5. As indicated in curve 503 amplifier 203 would have a maximum output at $V_{g1}$. By operating lock-in amplifier 203 in its 2f mode the output of amplifier 203 for various values of retarding grid voltage is shown by curve 504 in FIG. 5 which essentially corresponds to the second derivative of curve 501.

If the sample voltage decreases in value the field between the extraction grid and the integrated circuit increases in value and a larger number of electrons are detected by the energy analyzer for any given retarding grid voltage. This corresponds to a shifting of curve 501 to the position indicated by dotted curve 502 for a decrease in the sample voltage. This type of shift in sample voltage would in turn cause a lock-in amplifier to produce a negative voltage at output line 206 which in turn causes an increased voltage to be developed at line 209, and the feedback loop would operate such that at its new stable condition retarding grid voltage of $V_{g2}$ as shown in FIG. 5 would be present on line 209.

The presence of the sinusoidal voltage from oscillator 204 as a superimposed voltage on the DC component on line 205 counteracts the effect of changes that occur as a result of noise perturbations on the amplitude of the laser output from laser 10. As indicated in the curves of FIG. 4 and FIG. 5 the electron current is in arbitrary units because the precise amount of current is dependent on the power that is delivered to the integrated circuit from laser 10. This change in power essentially causes the curves to change in vertical amplitude on any scale that would correspond to absolute current. By superimposing the sinusoidal voltage from oscillator 204 the effect of these changes in laser output are eliminated providing the frequency of oscillator 204 is advantageously chosen to be greater than the frequency component of the noise perturbations from laser 10.

It was determined experimentally that the maximum extraction field was limited to about 5500 volts per millimeter. Above this value coronna discharge and electrical breakdown were observed. As indicated hereinabove, space between the extraction grid and the chamber was set at about 750 micrometers. This resulted in a temporal resolution of the measured voltage waveforms that was better than 40 psec. It is believed that the minimum spacing between extraction grid and sample is considerably less and may be in the order of 50 micrometers. This would improve the time resolution to about 10 psec.

What has been described hereinabove is an illustrative embodiment of the present invention. Numerous departures may be made by those skilled in the art without departing from the spirit and scope of the present invention. For example, other type lasers may be utilized to provide a beam which impinges on the metallization line. Any laser producing a pulse that is short in duration relative to the desired temporal resolution may be used providing sufficient output power can be provided to the line to produce multiphoton emission. In addition the delay structure provided by movable mirrors 14, 15 and stage 19 in FIG. 1 may instead be placed in the optical path between beam splitter 11 and photodetector 12. Furthermore, the electrical signal provided on line 18 by photodetector 12 may instead be provided directly by laser 10 in those lasers where an electrical signal synchronized to the output light pulse is available.

What is claimed is:

1. Apparatus for measuring a voltage waveform on an integrated circuit by using photoemission sampling comprising laser means for generating a pulsed laser beam directed toward an integrated circuit to be measured, means responsive to said laser means for generating an electrical signal which is coupled to the integrated circuit to be measured, an electron energy analyzer means positioned in the path of said pulsed laser beam adjacent to the integrated circuit to be measured for generating output pulses in response to electrons emitted from said integrated circuit, said electron energy analyzer means including an extraction grid made of a uniform grid of conductive wires and positioned as the most remote element in said electron energy analyzer means such that the extraction grid can be positioned immediately adjacent to said integrated circuit, and means responsive to the output pulses from said electron energy analyzer means for generating an output voltage whose value represents the voltage present in the voltage waveform being measured.

2. Apparatus as defined in claim 1 wherein said electron energy analyzer means further includes a retarding grid made of a uniform grid of conductive wires and positioned in parallel to said extraction grid a predetermined distance inside said electron energy analyzer means.

3. Apparatus as defined in claim 2 wherein said extraction grid is provided with a fixed potential, and said means responsive to the output pulses from said electron energy analyzer means includes a feedback circuit coupled so as to provide a voltage to said retarding grid.

4. Apparatus as defined in claim 3 wherein said feedback means includes a reference oscillator means for providing a sinusoidal voltage, which sinusoidal voltage is superimposed on the voltage coupled to said retarding grid.

* * * * *